US006829180B2

(12) United States Patent
Shau

(10) Patent No.: US 6,829,180 B2
(45) Date of Patent: *Dec. 7, 2004

(54) HIGH PERFORMANCE SEMICONDUCTOR MEMORY DEVICES

(75) Inventor: Jeng-Jye Shau, Palo Alto, CA (US)

(73) Assignee: Uniram Technology, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/442,016

(22) Filed: May 19, 2003

(65) Prior Publication Data

US 2003/0202405 A1 Oct. 30, 2003

Related U.S. Application Data

(62) Division of application No. 09/938,431, filed on Aug. 23, 2001, now Pat. No. 6,606,275.

(51) Int. Cl.[7] ................................................ G11C 16/04
(52) U.S. Cl. ............................ 365/189.09; 365/189.01; 365/206

(58) Field of Search ..................... 365/189.09, 189.01, 365/206, 230.03, 207

(56) References Cited

U.S. PATENT DOCUMENTS 5,619,465 A * 4/1997 Nomura et al. ............. 365/206
6,606,275 B2 * 8/2003 Shau ..................... 365/230.03

* cited by examiner

*Primary Examiner*—David Lam
(74) *Attorney, Agent, or Firm*—Bo-In Lin

(57) ABSTRACT

High performance memory devices have been realized by applying an Evenly Scaled Multiple Level Architecture (ESMLA) using block select arrangement. A single-bit-line-write mechanism allows us to reduce the number of bit lines by 50% for static memory devices. The resulting memory device can be as fast as registers files while its area is smaller than prior art high-density memory devices. The scaling method of the memory architecture also assures that the speed of the memory devices will scale in the same rate as logic circuits in future IC manufacture technologies.

11 Claims, 18 Drawing Sheets

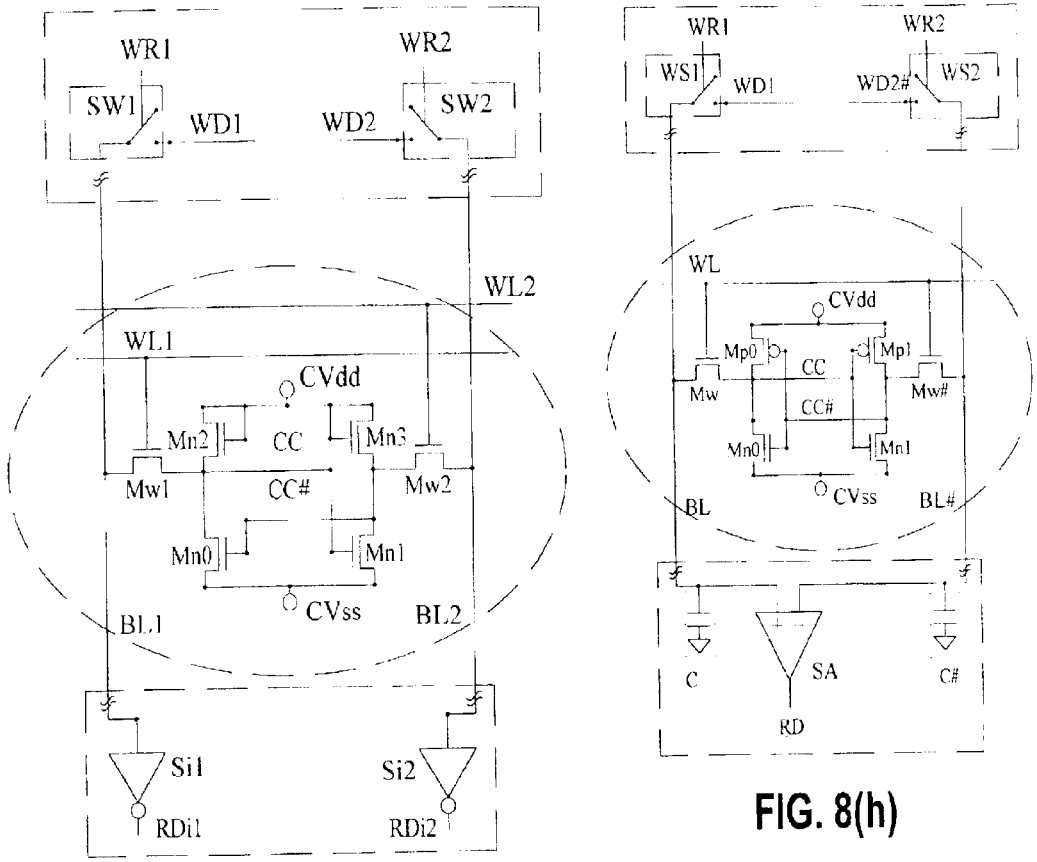
FIG. 8(g)
FIG. 8(h)
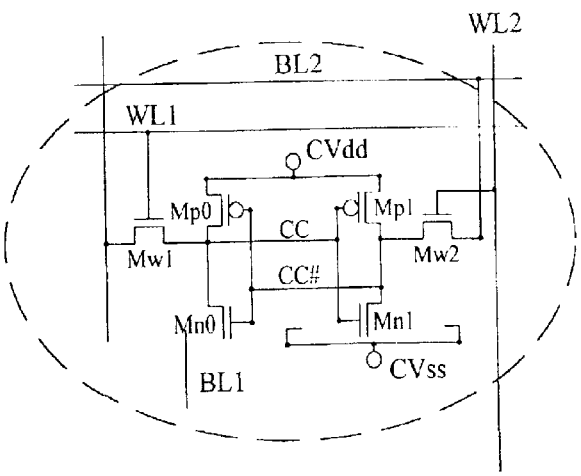
FIG. 8(i)

HIGH PERFORMANCE SEMICONDUCTOR MEMORY DEVICES

This is a Divisional application and claims the Priority Date of Aug. 23, 2001 of a previously filed application with Ser. No. 09/938,431 filed on Aug. 23, 2001 now U.S. Pat. No. 6,606,275 by the Applicant of this Invention.

FIELD OF THE INVENTION

The present invention relates to high performance semiconductor-memory devices, and more particularly to memory devices having multiple level architecture.

BACKGROUND OF THE INVENTION

Memory devices and logic circuits are two major types of circuit components used in integrated circuits (IC). As IC manufacture technologies progress, both the density and the performance of logic circuits have been improved exponentially. Current art logic circuits are operating at multiple GHZ (billion cycles per second), while each chip can have more than 100 million gates. The density of IC memory devices is also improved exponentially. Current art SRAM (static random access memory) can have 64M bits per chip, while DRAM (dynamic random access memory) can have 256 M bits per chip. However, the performance of memory devices has been improved in much slower rate than that of logic circuits. Current art SRAM is operating at 300 MHZ (million cycles per second), while DRAM access time stay around 15–60 ns (nano-second) for many generations. This performance gap between logic and memory circuits created a bottleneck in IC operation. The logic circuits are not able to operate at optimum speed because the supporting memory devices can not provide data and instructions fast enough. To make the matter worse, this performance gap is getting larger and larger as IC technology progresses. Memory bandwidth problem has been the limiting factor for most of the IC products, and the situation is getting worse.

The root cause for the performance problem of current art memory devices can be understood by examining their data access methods. FIG. 1 illustrates the basic structure of a memory device (101). This memory device contains m×n memory cells (103) connected by n horizontal word lines (WL1, WL2, . . . , WLj, . . . , WLn) and m vertical bit lines (BL1, BL2, . . . , BLi, . . . BLm), where m and n are integers. Each bit line is connected to one sensing circuit (S1, S2, . . . , Si, . . . , Sm) for detecting the data stored in the memory cells. For many memory devices, each memory cell may have two or more bit lines, while the sensing circuits may need more than one input lines. In FIG. 1, each bit line is represented by a single line in FIG. 1 for simplicity. To access the data in this memory device, one of the horizontal word line (WLj) is activated by one decoder driver (105) in the word line address decoder (107). A row of the memory cells connected to the activated word line (WLj) place data signals into vertical bit lines (BL1, BL2, . . . , BLi, . . . BLm) according to their storage data. The sensing circuits (S1, S2, . . . , Si, . . . , Sm) determines the content of those activated memory cells, and provide outputs to other devices. The word line driver (107) need to drive m devices on the word line (WLj). Each bit line (BLi) is connected to n memory cells. When the memory array is very large (for example, m=n=4K for a 16M device) the loading on word lines and bit lines are so large that it is very difficult to achieve high performance. Power consumption is another major problem. For each memory operation, one word line (WLj) and all the bit lines (BL1-BLm) are activated so that a large amount of power is consumed. For each new generation of IC technology, the driving capability of the word line driver (107) is typically improved by 30%, and the dimension of memory cell is typically reduced by 30% on each side, which are favorite factors for speed improvement. However, the requirement on the number of cells (m×n) are typically increased by 2 times in each side for each new generation. For each new generation of IC technology, the loading driven by each gate of memory device is reducing much less than the loading driven by each gate of logic circuits, while the driving capability of each gate is improving in similar rates for both memory and logic circuits, making it very difficult to improve memory performance in the same rate as logic circuits.

A few current art methods have been implemented to reduce the memory performance problem. One popular method is to arrange memory devices in multiple bank architecture as illustrated in FIG. 2(a). In this example, the memory device in FIG. 1 is divided into 4 independent banks. Each memory bank has a smaller memory array (201) that has m/2×n/2 memory cells. Each memory bank has its own sensing circuits (203) that sense m/2 bit lines, its own address decoder (205) that drives n/2 word lines, and its own controller (207) to control its activities. The individual operation within each bank should be faster than the large memory in FIG. 1 due to smaller dimension. However, the same data and control signals (209) need to go to all the banks, so that we will need a long routing channel (211) connecting all the banks. Operations required to control this routing channel (211) introduce additional delay. We can further divide the memory device into more banks (e.g. 16 banks) to make the operation in each individual bank faster, but that will require a much more complex routing channel with more delays caused by the routing channel. Due to this limitation, the multiple bank architecture usually achieves limited improvement in performance. Meanwhile, multiple bank architecture always introduces significant cost penalty because each bank needs to have its own peripheral circuits.

Another popular method is to use multiple level sensing architecture as illustrated in FIG. 2(b). In this example, the memory device in FIG. 1 is divided into 4 memory blocks (221). Each memory block has an m×n/4 memory array, and m first level sensing circuits (US1, US2, . . . , USi, . . . Usm). The outputs of these first level sensing circuits can be placed into second level bit lines (KBL1, . . . KBLi, . . . KBLm) through switches controlled by second level word lines (KWL1–KWL4). The second level bit lines are connected to the second level sensing circuits (KS1, . . . KSi, . . . KSm). This method improves first level sensing speed by reducing the first level bit line dimension, but second level sensing will cause additional delay. The area penalty is usually significant due to additional number of sensing circuits. There is no improvement in word line loading. To achieve performance improvement, the timing improvement in the first level sensing must be larger than the added delay in the second level sensing. In order to achieve that purpose, the driving capability of the first level sensing output need to be much stronger than that of memory cells. It is very difficult to increase the driving power of first level sensing because of tight pitch layout problem. Prior art first level sensing circuit need to follow the narrow pitch defined by memory cells, which is typically so small that any increase in driving capability will require significant area penalty. In reality, the multiple level sensing method in FIG. 2(b) achieves limited performance improvement due to the limitation form tight pitch layout induced area penalty. One method to reduce the tight pitch layout problem is to use a select switch before the first level sensing circuit as shown in FIG. 2(c). This method is usually called "Y select" method in the IC industry because it requires a decoder at a boundary vertical to the word line decoders. In this example, 4 nearby bit lines (BL1–BL4) are connected to 4 switches (S1–S4) that are controlled by 4 Y select signals (YS1–YS4). The common output (SBL) of those 4 switches are connected to the input of a sensor (SA). For each operation, one and only one of the 4 switches is activated, and the sensor (SA) will sense the data on the selected bit line. Using this Y select switch, we will need only 1 sensor for every 4 bit lines. Therefore, there are 4 times more area available to layout the sensor. This method does not work for DRAM because the memory cells (241) connected to unused bit lines will loose its storage data. Therefore, Y select method can not be used for DRAM first level sensing. The Y select method works for SRAM, but the Y select switches occupies significant area, especially when we try to increase the number of bit lines connected to each sensing circuit. There is also significant waste in power because all the power used to drive the unused bit lines are wasted.

A current art memory device typically uses all of the above methods. A typical DRAM usually contains 4 banks, each memory bank has two levels of sensing, while the second level sensing uses Y select. However, the above methods achieve limited performance improvement due to limitations discussed in above sections. With the helps of all of the above methods, the performance gap between logic and memory IC is still getting wider and wider. It is therefore highly desirable to provide novel methods to further improve the performance of memory devices. It is also highly desirable to avoid the area and power penalty introduced by prior art methods.

Besides area and power penalties, another important penalty introduced by current art memory design is noise sensitivity. Because the bit line loading is typically very large, current art memory devices use small signal sense amplifiers as sensing circuit. The small signal sense amplifiers are able to determine the output data while the signals on a bit line pair are not fully developed. This capability improves performance significantly because we do not need to wait for fully developed signals. However, the small signal sensing and its associated control mechanism must be fully isolated from any noise sources. Therefore, a current art memory device must be carefully isolated from other type of circuits. FIG. 3 illustrates the floor plan of a typical current art IC that contains embedded memory and logic circuits. In this example, the IC contains one large memory module (301), one smaller memory module (309), random logic circuits (303), routing channels (305), and a register file (307). Current art memory modules can be easily recognized by its regular structures. All the circuits, including associated data and control signals, in the memory module must be carefully isolated from other types of modules. The logic circuits (303), which can be recognized by its random wire connections, must be arranged away from memory modules (301, 309) for noise consideration. Therefore, memory devices become communication barriers in the floor plan. Typically, we need large routine channels (305) for communication between those modules. Routing channels usually can not go through memory modules for noise consideration. Routing channels going through memory modules is possible only for high level metal layers after the memory modules already shielded by low level metals. Waste in area, power, and degradation in performance often caused by the fact that the communication barrier caused by memory modules. It is therefore highly desirable to reduce the noise sensitivity of memory devices for embedded applications, so that memory modules will no longer be communication barriers.

SUMMARY OF THE INVENTION

The primary objective of this invention is, therefore, to improve the performance of semiconductor memory device. Another objective is to achieve performance improvement without significant penalties in area, power, and complexity. Another primary objective is to reduce noise sensitivity of memory devices for better floor planning of embedded IC products.

These and other objects are accomplished by a semiconductor memory device according to the invention, which includes a novel multiple level memory architecture and a novel single-bit-line-write (SBLW) memory update mechanism.

According to the present invention as described herein, the following benefits, among others, are obtained.
(1) The performance of memory devices is improved by near one order of magnitude.
(2) Dramatic reduction in power consumption is achieved with performance improvement.
(3) Smaller memory area is also achieved due to better array efficiency.
(4) Simplification in memory design improves yield and reduces manufacture complexity.
(5) Additional area saving and performance improvement are achieved due to simplification in supporting logic circuits.

While the novel features of the invention are set forth with particularly in the appended claims, the invention, both as to organization and content, will be better understood and appreciated, along with other objects and features thereof, from the following detailed description taken in conjunction with the drawing.

BRIEF DESCRIPTION OF THE DRAWINGS

FIG. 8(g) is the schematic diagram for a 6T NMOS dual port memory using SBLW;

FIG. 8(h) is the schematic diagram for a 6T 1R2W memory using SBLW;

FIG. 8(i) is the schematic diagram for a 6T dual memory having vertical data paths.

DETAILED DESCRIPTION OF THE INVENTION

Figure 4:
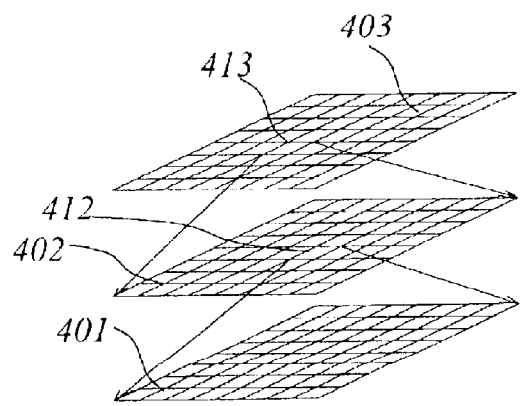
FIG. 4 is a symbolic representation for a multiple level architecture of the present invention.

Referring to the simplified symbolic diagram shown in FIG. 4 for the basic concept of the present invention. A memory device is arranged in multiple levels. At the top-level (403), the memory device appears to be a small array with small number of top level cells (413) on each side. Each top-level cell (413) also appears to be a small second level array (402) with a small number of second level cells (412). We can have many levels. Eventually, we will reach the bottom level (401) that is actually a small memory array with a small number of real memory cells (411). For example, a 1G (billion)-bit memory array is configured into three levels. The top level is formed as a "virtual" 32×32 array, the second level is formed as another "virtual" 32×32 array, while the bottom level is a real 32×32 memory array.

To access a set of data in the memory, the memory address is separated into three sub-sets to the decoders in three levels and decoded simultaneously. One bottom level memory array is activated with 32 outputs sent to a second level cell, then in turn sent to the top level. For each data access operation, only one of the one million arrays on the bottom level is activated, and only 32 signals are activated. All the unused lines not designated by the three-level address are not activated. Extremely high performance is achieved while using minimum power. The driving capability of the word line drivers and sensing circuits in each level are scaled according to the loading on each level. For example, if the loading on the second level is roughly 32 times larger than the loading on the first level, then the driving capability of the second level cell (412) should be about 32 times that of the first level cell. The cells on each level should be capable of supporting most of its operations so that the number of external signals needed to reach each cell is very small. Ideally, at any level there should be only a few decoded control signals going to a cell, and a few scaled outputs going out of a cell, so that the loading seen by the drivers at different levels are minimized. In this way, all the levels will have similar speed as a simple 32×32-memory array to achieve extremely high performance. The driving capability and loading of a memory device under this architecture are scaled in the same way as typical logic circuits, so that the performance of such memory device will be about the same as logic circuits. In addition, the performance of a memory device arranged in such architecture will scale in the same rate as logic circuits for each new generation of IC technology. The key feature for the architecture in FIG. 4 is that the number of data and control signals scaled down relative evenly for each higher level. Using the 1G 3 level memory as an example, the total number of word lines and bit lines on each side of the second level cell is 1/32 of the word lines and bit lines of the first level cell. Similarly, the total number of word lines and bit lines on each side of the third level cell is 1/32 of the word lines and bit lines of the second level cell. Such architecture is called "Evenly Scaled Multiple Level Architecture" (ESMLA) in the present invention.

Figure 1:
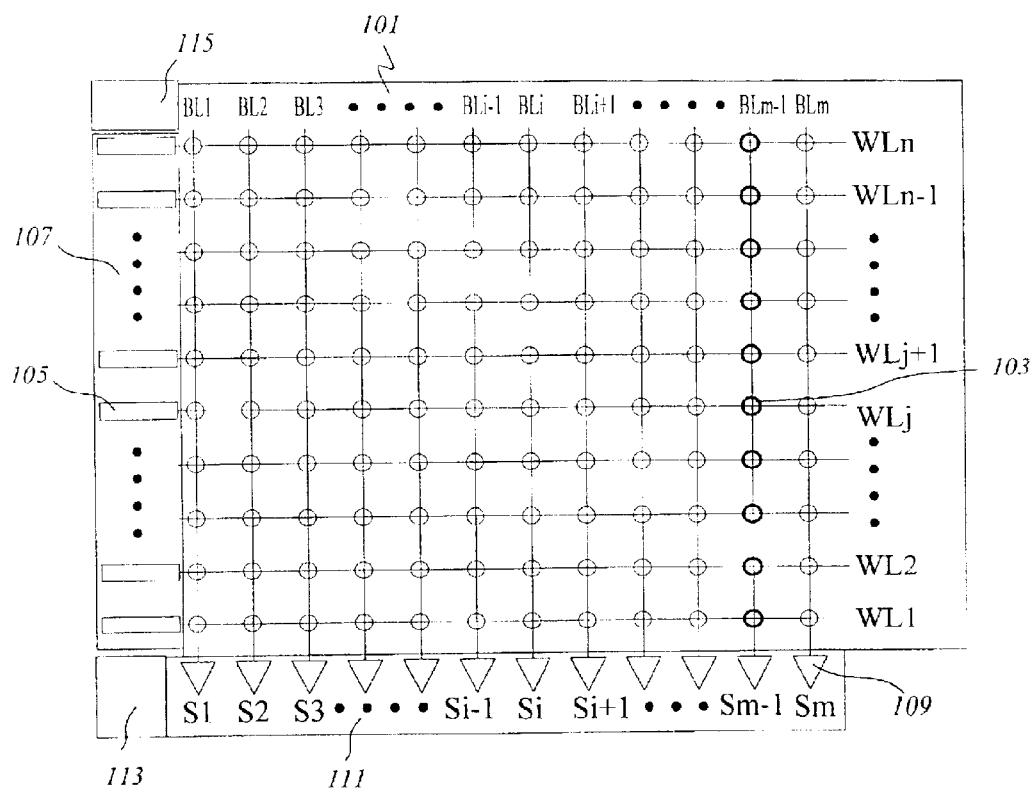
FIG. 1 is illustrates the basic structures of a prior art memory device.
Figure 2A:
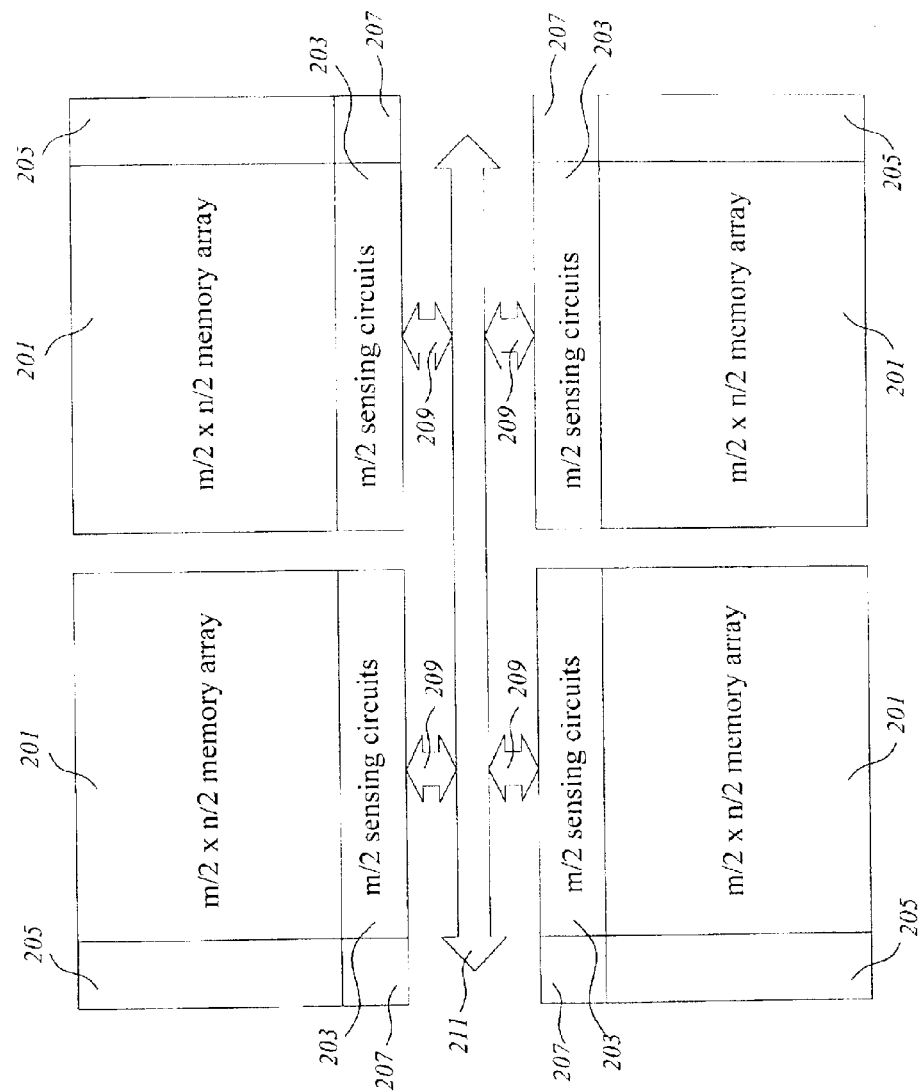
FIG. 2(a) shows the structure of a prior art multiple bank memory device.
Figure 2B:
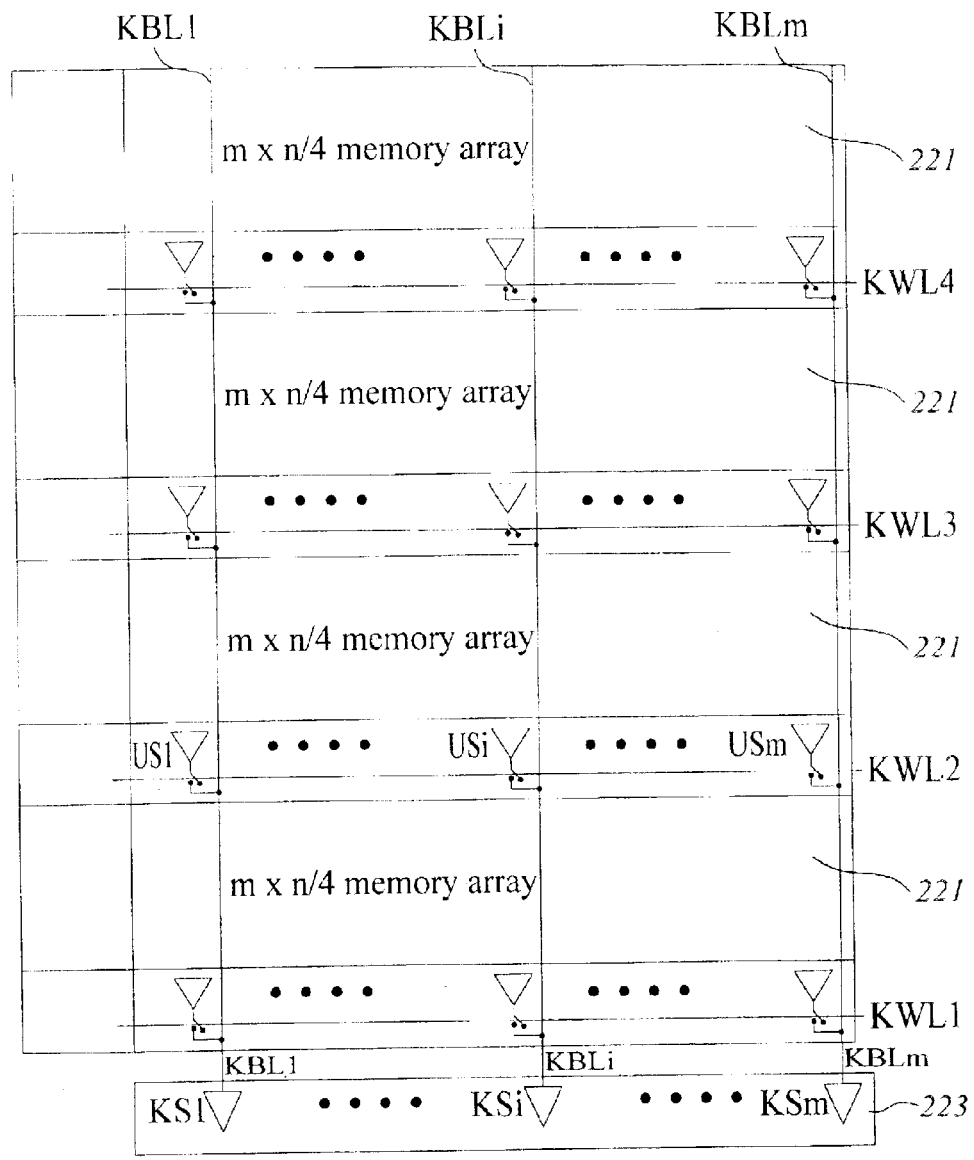
FIGS. 2(b, c) show the structure of prior art two level sensing architecture and Y-select architecture respectively.

The prior art multiple bank architecture in FIG. 2(a) does not meet the requirements of ESMLA because most of the address, control, and data signals need to go to all the banks. Under multiple bank architecture, the loading on the routing channel carrying those signals is so high that it can not has the advantages of ESMLA. The multiple level sensing method in FIG. 2(b) does not meet the requirements of ESMLA because (1) there is no scaling along word line direction, (2)there is no or limited (if Y select method is used) change in the density of bit lines between different levels, and (3) the driving capability of the sensing circuit is not scaled properly due to the limits enforced by tight pitch layout problem. However, ESMLA can co-exist with prior art architectures. For example, an EMSLA architecture can support an architecture of multiple banks with each bank arranged based on an ESMLA loading scale as describe above.

One obvious problem for ESMLA is area efficiency. If each bottom level memory array uses supporting peripheral circuits (sensing circuits, decoders, pre-charge circuits) in the same ways as prior art memory, most of the areas would be occupied by the peripheral circuits. The resulting area will be too large to make practical ESMLA products. For high level ESMLA circuits, the density of signals is very low, there is no difficulty to achieve high area efficiency while keeping proper scaling factors. The problem is in the bottom level. The tight pitch layout problem making it difficult to achieve proper scaling factor while obtaining high area efficiency. It is therefore necessary to develop novel bottom level memory architecture to solve the tight pitch layout problem.

Using DRAM design as an example, the Applicant of this invention disclosed a method to solve the problem in U.S. Pat. No. 5,748,547. The concept is further generalized to support all types of memory devices as illustrated in FIGS. 5(a–c). For the example shown in FIG. 5(a), memory cells are arranged into small unit blocks (MB1–MB16). One example of a unit block (MB1–MB16) may have 32 word lines (not shown for simplicity) and 8 bit lines, but the actual dimension varies with applications. A plurality of unit block (MB1–MB16) are grouped together to form a unit group (501). Each unit block (MB1–MB16) can be activated by its corresponding block select signal (BS1–BS16). To access one set of data stored in one unit group, one and only one of the unit block (MB1–MB16) is activated by activating one and only one block select signal (BS1–BS16). The local word lines (not shown for simplicity) in the unit blocks (MB1–MB16) are also gated by the block select signals so that one and only one word line in the unit group 501 can be activated at any time. The local bit lines (BL1–BL8) in the unit blocks (MB1–MB16) are connected to the group bit lines (UBL1–UBL8) through block select switches 503 controlled by block select signals (BS1–BS16). The first local bit line (BL1) in each memory block (MB1–MB16) is connected through a switch controlled by its corresponding block select signal (BS1–BS16) to the same group bit line (UBL1) that is connected to the first sensing circuit (BS1). The second local bit line (BL2) in each memory block (MB1–MB16) is connected through a switch controlled by its corresponding block select signal (BS1–BS16) to the same group bit line (UBL2) that is connected to the second sensing circuit (BS2). All the rest of the local bit lines (BL3–BL8) in each memory block (MB1–MB16) are connected in similar ways to corresponding group bit lines (UBL3–UBL8) and sensing circuits (BS3–BS8). To access the data stored in the first memory block (MB1), its block select signal (BS1) is activated while all the other block select signals (BS2–BS16) remain inactive. By turning on the block select signal BS1, the local bit lines (BL1–BL8) are connected to sensing circuits (BS1–BS8) through UBL1–UBL8. All the local bit lines in other unit blocks (MB2–MB16) are isolated from the sensing circuits because their block select switches are turned off. One and only one local word line in the activated unit block is activated, and one and only one row of the memory cells in the activated unit block is accessed. The data stored in other memory blocks (MB2–MB16) are accessed in similar ways through turning on different block select signals. This type of arrangement is called the "block select" or "B select" method in the present invention.

The B select method is extremely flexible. A circuit designer is provided with great degree of freedom and flexibility to arrange memory data path using the B select method. The sensing circuit and other peripheral circuit no longer need to follow tight pitch layout defined by memory cell dimensions. The area available for sensing circuit is by far larger than that of prior art memory devices. FIG. 5(b) shows an example for a two-level B select method. In this example, eight (8) unit blocks are connected by B select method to form a sub-group (MBS1–MBS8). There are no sensing circuits in these sub-groups (MBS1–MBS8). The group bit lines in the subgroups are connected to sensing circuits (SS1–SS8) through another set of B select signals (SBS1–SBS8) to form a two-level B select group. The sensing circuits can be placed with great freedom. It is even possible to place sensing circuit in multiple levels of B select signals as shown in FIG. 5(c). In this example, one of the sub-group (MBS1) is equipped with sensing circuits 531, which will allow simultaneous access at two different levels. The scheme in FIG. 5(c) is especially useful for simultaneous multiple port operations. It is very important to distinguish the difference between multiple level B select methods and multiple level memory architecture shown in FIG. 4. The multiple level B select method is used within one of the level in a multiple level memory. On the other word, one level of the multiple level memory in FIG. 4 can have many sub-level B select connections.

Figure 2C:
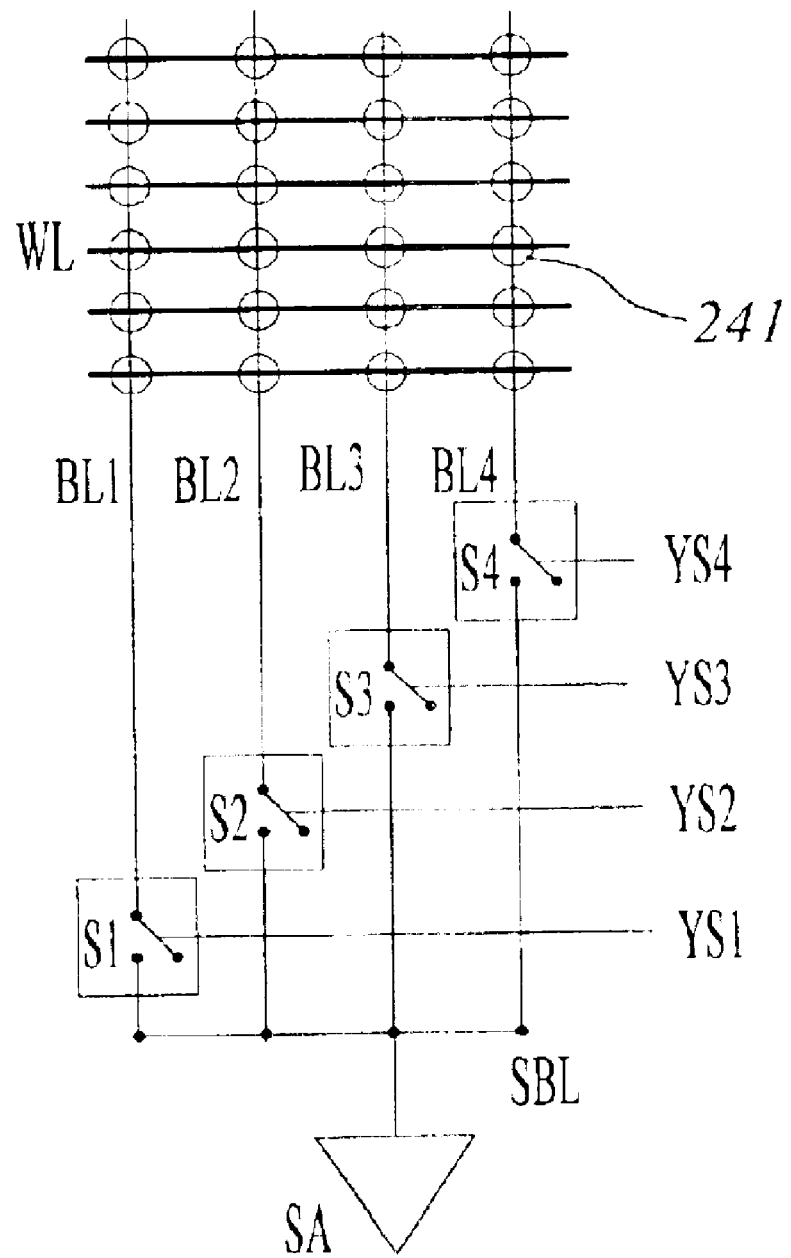

The B select method is different from the prior art "Y select" method illustrated in FIG. 2(c) in the following ways:

(1) The "Y select" method select one cell from a set of memory cells (241) that are activated by the same word line through Y select switches to the same sensing circuit. Since the unused cells are activated at the same time when the selected cell is activated, unused signals are driven to the unused bit lines wasting power unnecessarily. The Y select method is not useful for DRAM because the data stored in the unused DRAM cell would be destroyed. The "B select" method selects one cell from one activated unit block to one sensing circuit. All the other cells sharing the same sensing circuits are in different unit blocks so that they are not activated. There is no waste in power, and there is no unused resource activated. The "B select" method can be used for DRAM because all the activated memory cells are connected to sensing circuits.

(2) The "Y select" method use multiple Y select signals to select one of the nearby bit lines to the sensing circuit. Since the Y select switches need to follow the pitch defined by memory cells, there is tight pitch layout problem so that the Y select circuits occupy relatively large layout area. The loading on each Y select signal is very high because they need to travel through large dimension. The "B select" method uses one block select signal to activate all the cells needed to be activated. The structure for the B select switches are very simple so that they occupy small areas. The block select signal stays in a small dimension so that its loading is very small comparing to the Y select signals.

Figure 5A:
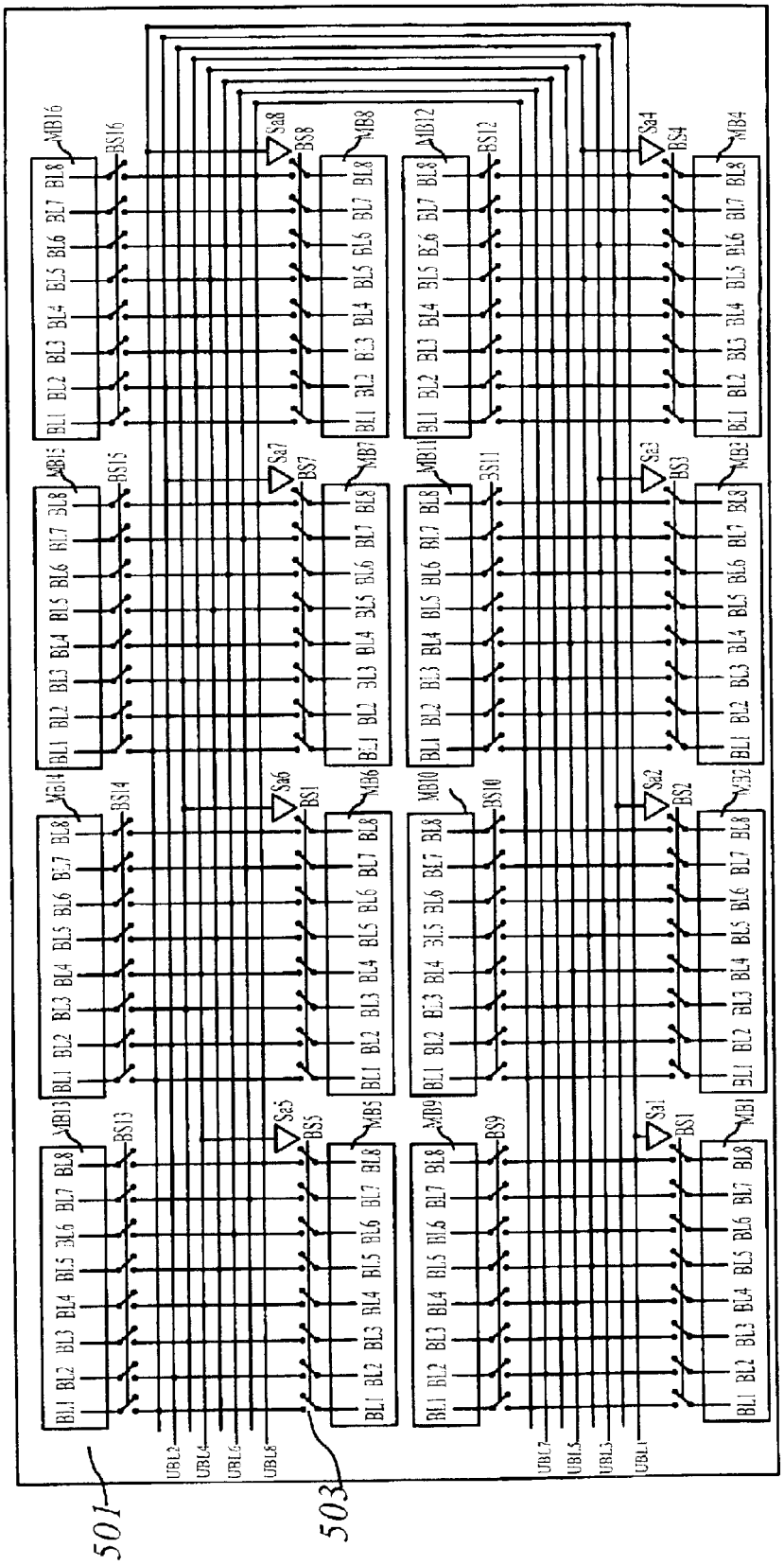
FIG. 5(a) shows an example for the B select method of the present invention.
Figure 5B:
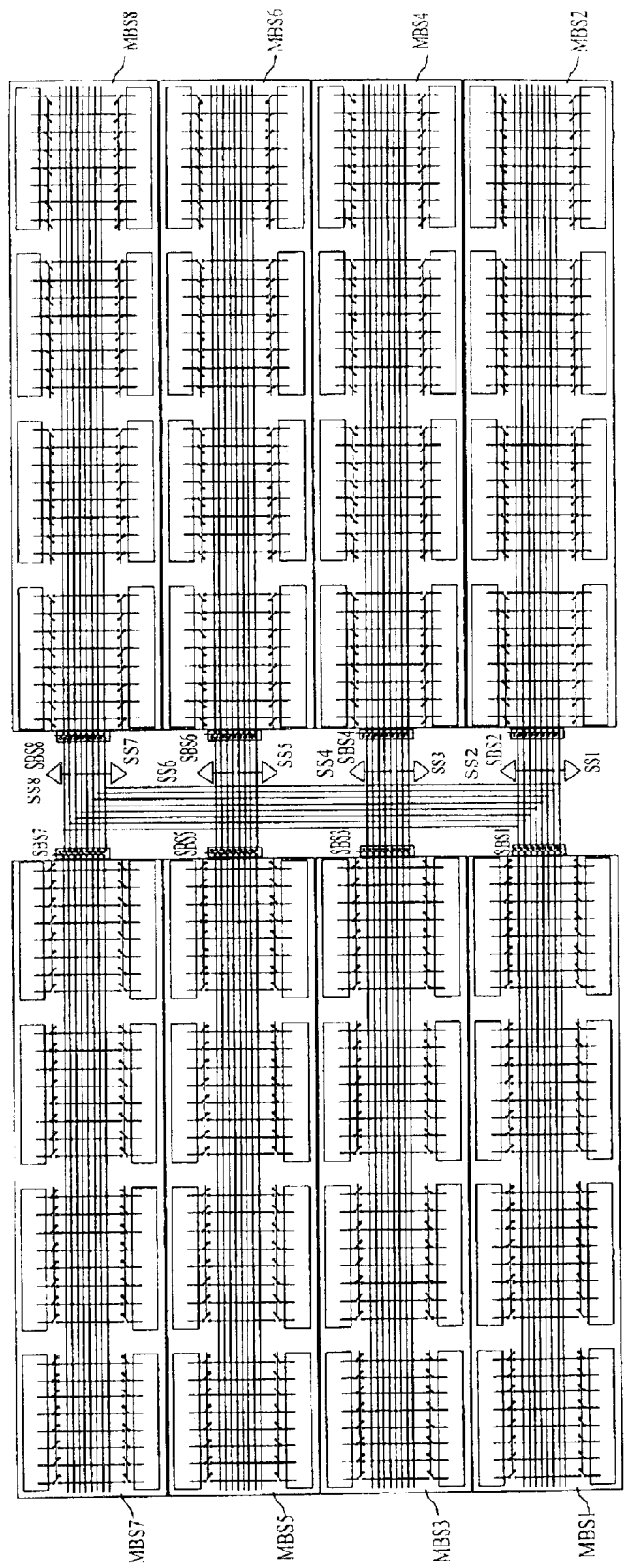
FIG. 5(b) shows another example for a two level B select method of the present invention.
Figure 5C:
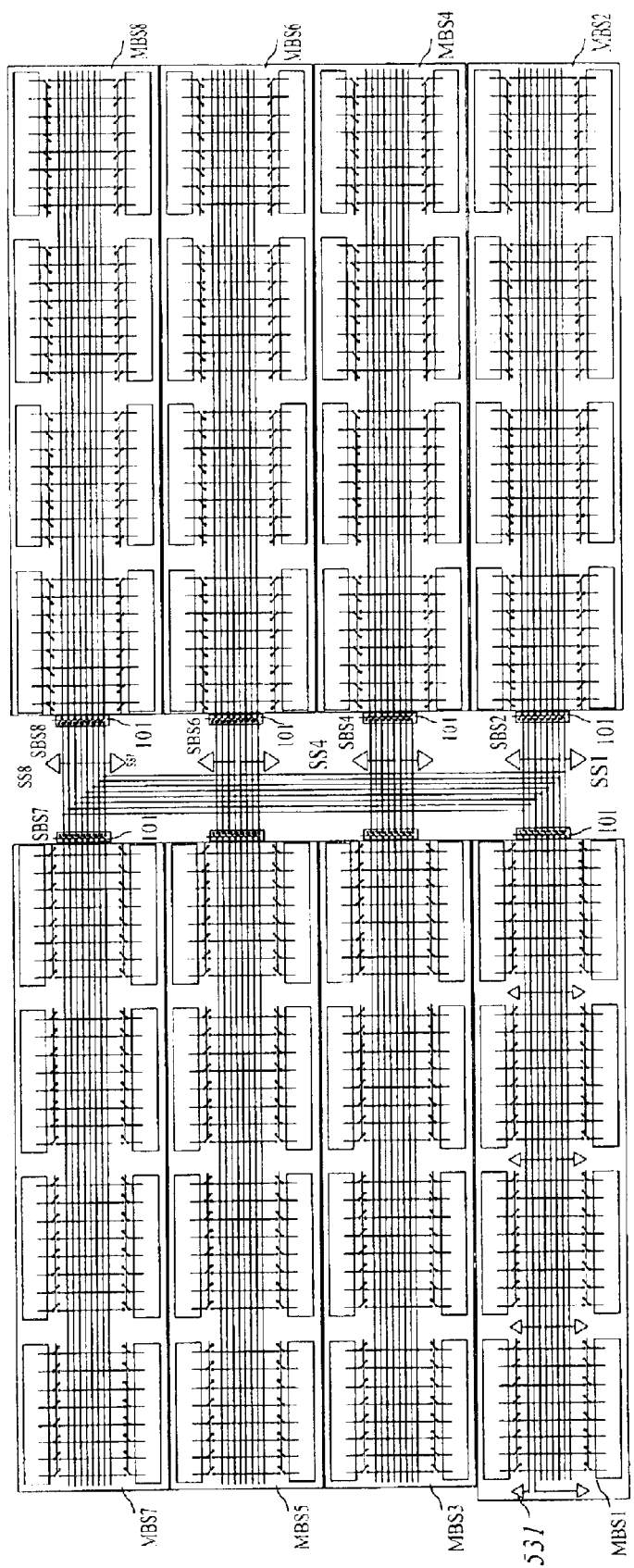
FIG. 5(c) shows a two level sensing method for a B select method of the present invention.
Figure 5E:
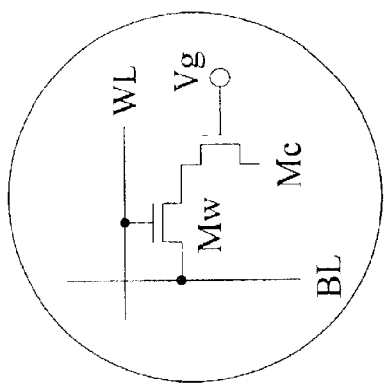
FIG. 5(e) shows the structure of a two-transistor DRAM memory cell.
Figure 5G:
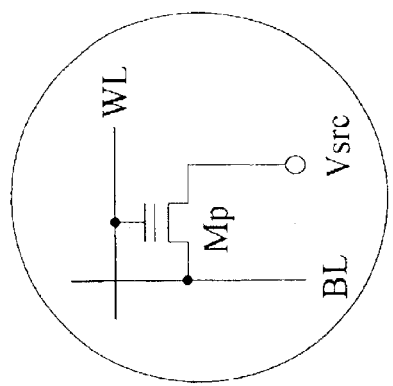
FIG. 5(g) shows the structure of a floating gate memory cell.
Figure 5D:
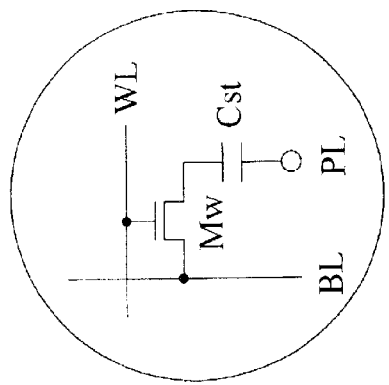
FIG. 5(d) shows the structure of a DRAM memory cell.
Figure 5F:
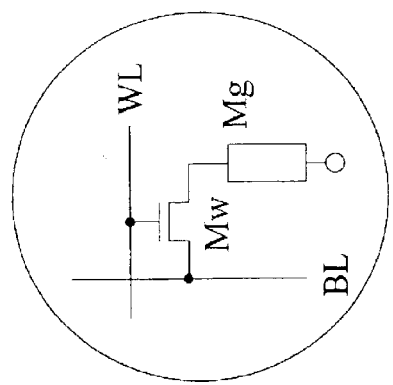
FIG. 5(f) shows the structure of a magnetic memory cell.

(3) The total loading seen by one sensing circuit in the Y select method of FIG. 5(a) is equal to the loading of one local bit line (BL1–BL8) plus the loading of one group bit line (UBL1–UBL8). The loading in all the unused blocks are isolated by the block select switches. Therefore, a large number of memory cells (all the cells in 16 memory blocks) can share the same sensing circuit while maintaining excellent signal-to-noise ratio. For example, using the Y select method, the present inventor is able to design a memory that use one sensing circuit to support as many as 16 thousand memory cells while achieving better signal-to-noise ratio than a prior art memory that connects only 256 memory cells to a sensing circuit. Using Y select method on SRAM, the loading on bit lines is so small that we no longer need to use differential sense amplifiers.

(4) Using B select method, the dimensions of the sensing circuits and other peripheral circuits are no longer confined by the dimension of the memory cells. Circuit designers enjoy great freedom in controlling the size and location of the sensing circuit. Our experience in designing real commercial product showed that using B select method we can design sensing circuits that are by far more sensitive then those used in prior memory devices. It is therefore possible to build practical ESMLA products while achieving excellent area efficiency.

The novel memory architecture of the present invention provides significant improvements by changes in circuit arrangements. These improvements can be achieved without any modification to prior art memory cells or manufacture technologies. On the other hand, further improvements can be achieved by optimizing current art memory cells or manufacture technologies. The following sections describe modifications made to prior art static memory devices as examples to demonstrate the several embodiments of the present invention.

Figures 6A, 6B:
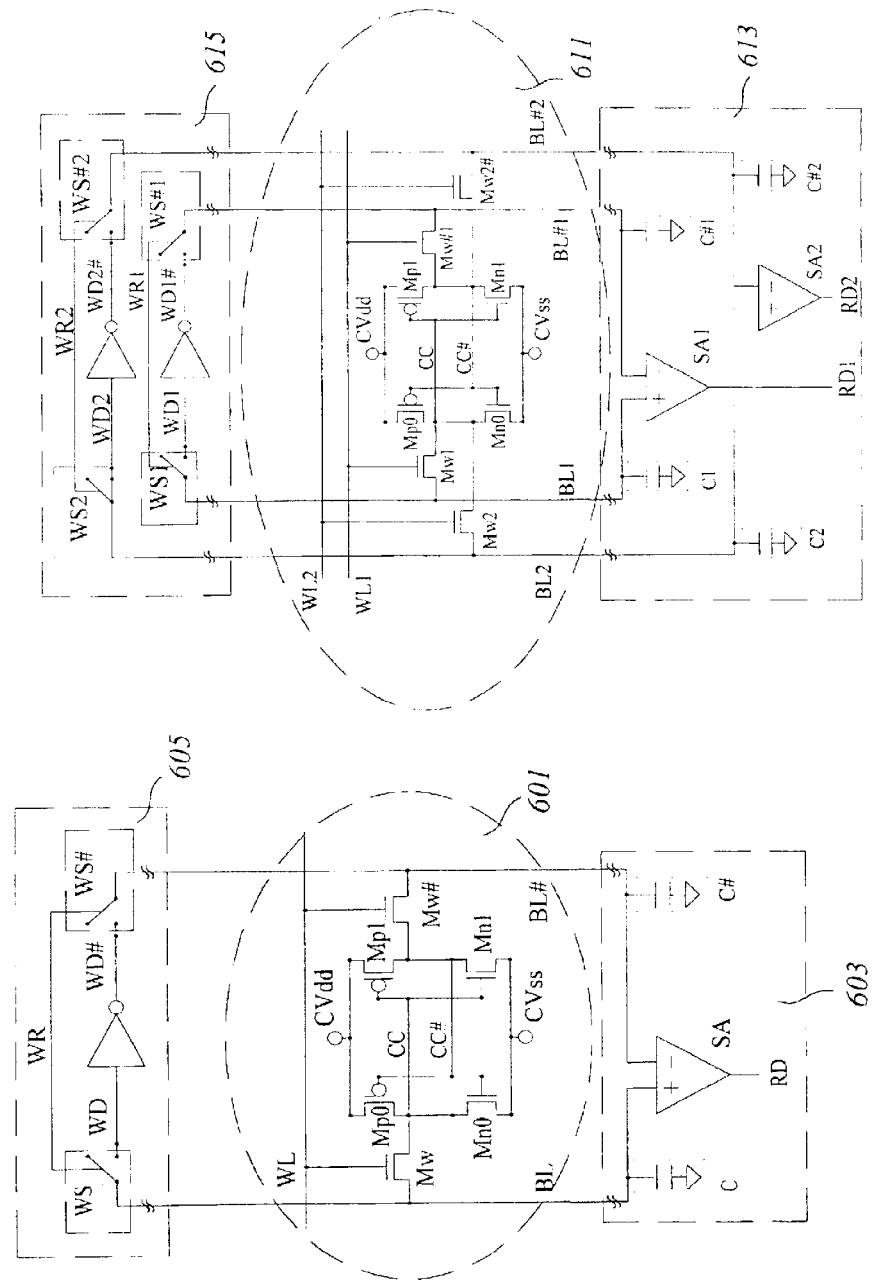
FIG. 6(a) is a schematic diagram for a prior art 6T single port static memory.
FIG. 6(b) is a schematic diagram for a prior art 8T dual port static memory.

The operation principles of prior art static memory devices are first described in details to facilitate understanding on potential modifications optimized for the novel architecture. FIG. 6(a) shows the schematic diagram for a standard six-transistor (6T) CMOS static memory. The 6T-memory cell (601) comprises 6 transistors. Two p-channel transistors (Mp0, Mp1) and two n-channel transistors (Mn0, Mn1) are connected as back-to-back inverters to form a static latch. The sources of Mp0 and Mp1 are connected to the memory cell positive power supply (CVdd). The sources of Mn0 and Mn1 are connected to the memory cell negative power supply (CVss). The drains of Mp0 and Mn0 are connected to the first storage node (CC), while the drains of Mp1 and Mn1 are connected to the second storage node (CC#). The first storage node CC can connect to a bit line (BL) through a select transistor (Mw) controlled by word line (WL). The second storage node CC# can connect to a second bit line (BL#) through another select transistor (Mw#) controlled by word line (WL). The bit lines (BL, BL#) are shared by many other 6T cells connected to other word lines (not shown for simplicity). The loading (C, C#) on the bit line pair (BL, BL#) can be very high when a large number of memory cells share the same bit line pairs. Due to a positive feedback mechanism, those two back-to-back inverters form a bi-stable latch. If the voltage of CC is at CVdd, it will force the voltage of CC# stay at CVss, which in return will force CC to stay at CVdd. If the voltage of CC is at CVss, it will force the voltage of CC# to stay at CVdd, which in return will force CC to stay at CVss. This storage mechanism is extremely stable. As soon as the word line (WL) turns off the select transistors (Mw, Mw#), the storage nodes will stay at their original states. To change the state of the latch, we need to use external circuit to drive the voltage on the storage nodes (CC, CC#) cross the trigger voltage (Vtrg) of the latch. This trigger voltage (Vtrg) is determined by the relative driving capabilities of the cell transistors (Mp0, Mn0, Mp1, Mn1) and the memory cell power voltages (CVdd, CVss). The bit line pair (BL, BL#) are connected to sensing circuits (603) in order to read the data stored in the memory cell. In this example, a differential sense amplifier (SA) is connected to the bit line pair (BL, BL#) as the sensing circuit. The output of the sense amplifier (RD) will be high if the voltage on BL is higher than the voltage on BL#, and it will be low if the voltage on BL is lower than the voltage on BL#. The bit line pair (BL, BL#) are also connected to memory write circuits (605) for writing new data into the memory cell (601). In this example, the write circuits (605) is controlled by a write enable signal (WR). During a write cycle, the write enable signal (WR) activates write enable switches (WS, WS#) so that the write data (WD) is driven into BL, while the inverted write data (WD#) is driven into BL#. The write circuits (605) are isolated from the bit line pairs (BL, BL#) when the write enable signal (WR) is not activated.

Figure 7A:
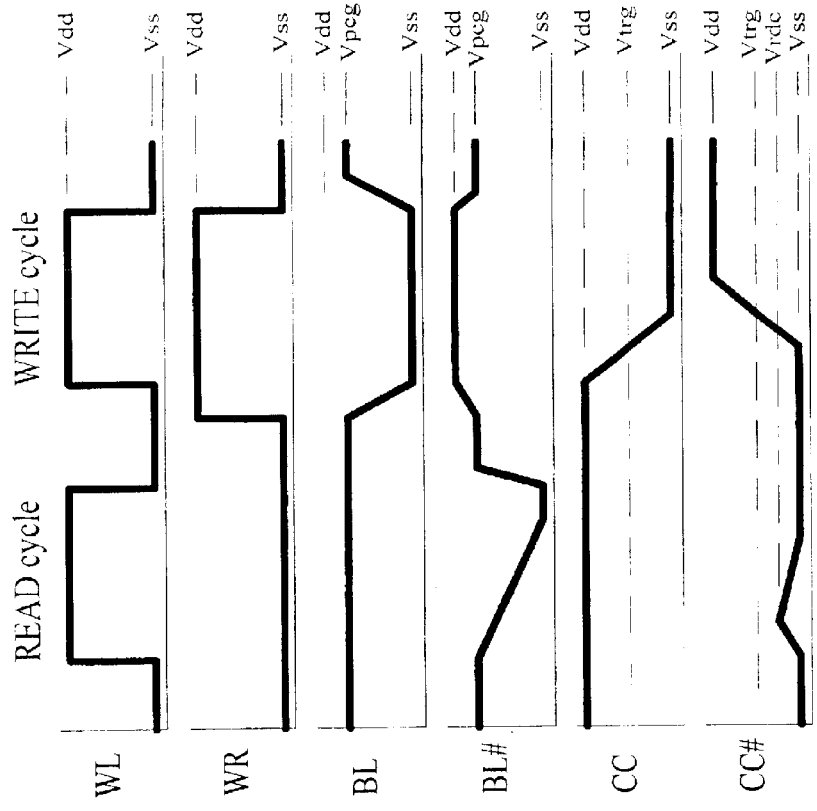
FIG. 7(a) illustrates the operation procedures for a prior art static memory.
Figure 6C:
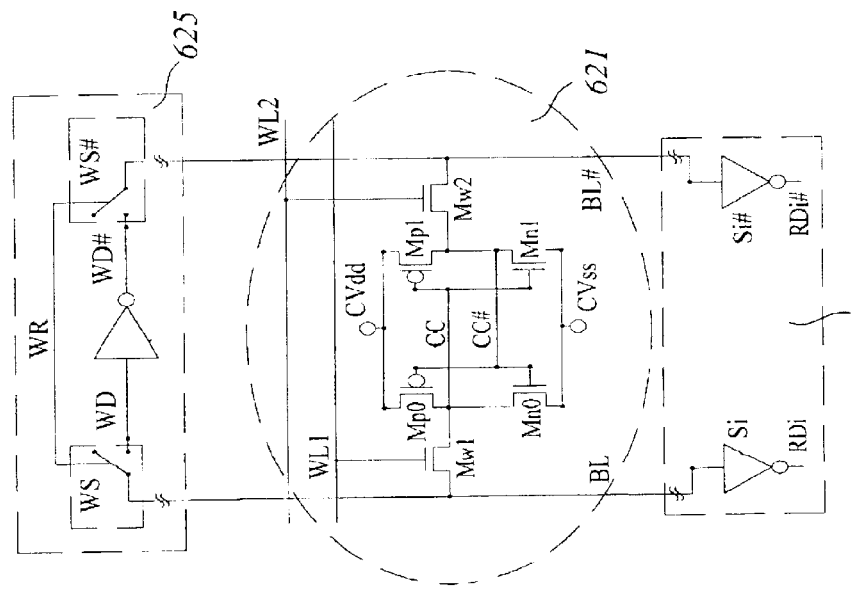
FIG. 6(c) is a schematic diagram for a prior art 6T 2 read port 1 write port static memory.

The timing diagram in FIG. 7(a) illustrates the basic operation procedures for the 6T static memory device in FIG. 6(a). When the memory device is idle, all the word lines are not activated. The bit line pairs are driven to the same pre-charge voltage (Vpcg) by pre-charge circuits (not shown for simplicity). Vpcg is typically set at a voltage about one threshold voltage lower than the power supply voltage (Vdd). All the memory cells (601) are latched at their original state. In this example, CC is at Vdd, while CC# is at ground voltage Vss. During a read cycle, the word line (WL) is activated while the write enable signal (WR) remain inactive as shown in FIG. 7(a). The pre-charge circuits would be deactivated allowing the memory cell (601) to drive the bit line pairs (BL, BL#). Due to charge sharing from BL#, the voltage on the storage node CC# of the selected 6T cell will rise to a voltage Vrdc after the word line (WL) has been activated. Then the memory cell will take over to drive the bit line (BL#) lower so that the sensing circuit (603) can detect the storage data of the memory cell. The voltage Vrdc is called "read disturb voltage". It is very important that Vrdc is always kept below the trigger voltage (Vtrg) of the memory cell during a read cycle. If Vrdc is allowed to reach Vtrg, the state of the memory cell can be changed unintentionally during a memory read operation. This problem is called "read disturb" problem in the IC industry. In order to avoid the read disturb problem, circuit designers must carefully adjust the relative driving capabilities between the memory select transistors (Mw, Mw#) and the memory latch transistors (Mp0, Mp1, Mn0, Mn1) to assure Vrdc is always smaller than Vtrg under all possible operation conditions. During a write cycle, both the word line (WL) and the write enable signal (WR) are activated, as shown in FIG. 7(a). In this example, BL is driven to Vss while BL# is driven to Vdd by the memory write circuits (605). The storage node CC is driven across Vtrg by the write circuit so that the storage state of the memory cell is changed to desired new state after the write operation. It is very important that the write circuit is able to drive the voltage on CC below Vtrg. If the voltage on the storage node (CC) is not driven cross trigger voltage (Vtrg), the state of the memory cell (601) won't be changed to desired new state. This problem is generally referred to as the "write stability" problem in the IC industry. In order to avoid the write stability problem, circuit designers must carefully adjust the relative driving capabilities between the memory select transistors (Mw, Mw#) and the memory latch transistors (Mp0, Mp1, Mn0, Mn1) to assure the memory state can be changed during a write cycle under all possible operation conditions. The requirements between read disturb problem and write stability problem conflicts with each other. By adjusting the sizes of the memory transistors a high voltage can be written into the memory cell, however, that cell will fail due to the read disturb problem. Conversely, in order to prevent the read disturb problem, the size of the memory transistors can be adjusted so that a high voltage can never change the state of the memory cell. However, that would prevent a high voltage to be written into the memory cell. The current art method to solve this problem is to adjust the sizes of the memory cell transistors so that a high voltage on bit line can never change the state of the memory cell. In the meantime, by pulling down the voltage on the bit line the state of the memory cell is changed. Under the circumstance of writing a high voltage into CC#, the procedure is by first writing a low voltage into CC so that the memory latch flips the voltage of CC# to a high voltage. It is not possible to write a high state into CC# directly from BL#. In this way, the memory device can have excellent stability for both read and write operations. That is why current art static memory must use a pair of bit lines to support each write port. During a write operation, both the write data (WD) and the inverted write data (WD#) must be placed on the bit line pair (BL, BL#) while only the bit line pulled down to low voltage can change the state of the memory cell. Under the circumstance where there is only one bit line, the memory cell can only change into one state, and it is not possible to change the state that requires writing a high voltage into the memory cell through that single bit line. Fir these reasons, prior art write mechanism always requires a pair of bit line is called "dual-bit-line-write" (DBLW) mechanism in the present invention. When the bit line loading (C, C#) are high, it is also required to use bit line pairs to support read operation because differential sense amplifiers are employed to achieve higher read performance. These requirements are the reason why current art static memory always need to have a pair of bit lines (BL, BL#) and uses 6 transistors to support a single port memory operation. To support dual port operations, prior art static memory need to use an eight transistor (8T) memory cell as shown in FIG. 6(b). This 8T cell connects to two pairs of bit lines (BL1, BL1#, BL2, BL2#). Its area is typically twice the area of the 6T single port memory cell. It is well known that prior art 6T memory cell (601) can support dual port read operation if the loading (C, C#) on bit lines are small enough. FIG. 6(c) shows a schematic diagram for a dual-port-read-single-port-write (2R1W) static memory according to the prior art configuration. The select transistors (Mw1, Mw2) for this 2R1W memory cell (621) are connected to separated word lines (WL1, WL2). The read circuits (623) for this 2R1W memory comprise two separated sensing circuits (Si, Si#). The input of the first sensing circuit (Si) is connected to BL, while the input of the second sensing circuit (Si#) is connected to BL#. It is therefore possible to read two sets of data from the 2R1W memory simultaneously. The write circuits (625) for the 2R1W memory is the same as that of single port memory because prior art write mechanism must use a pair of bit line. Therefore, it is only possible to execute single port write operation at any given time.

Figure 7B:
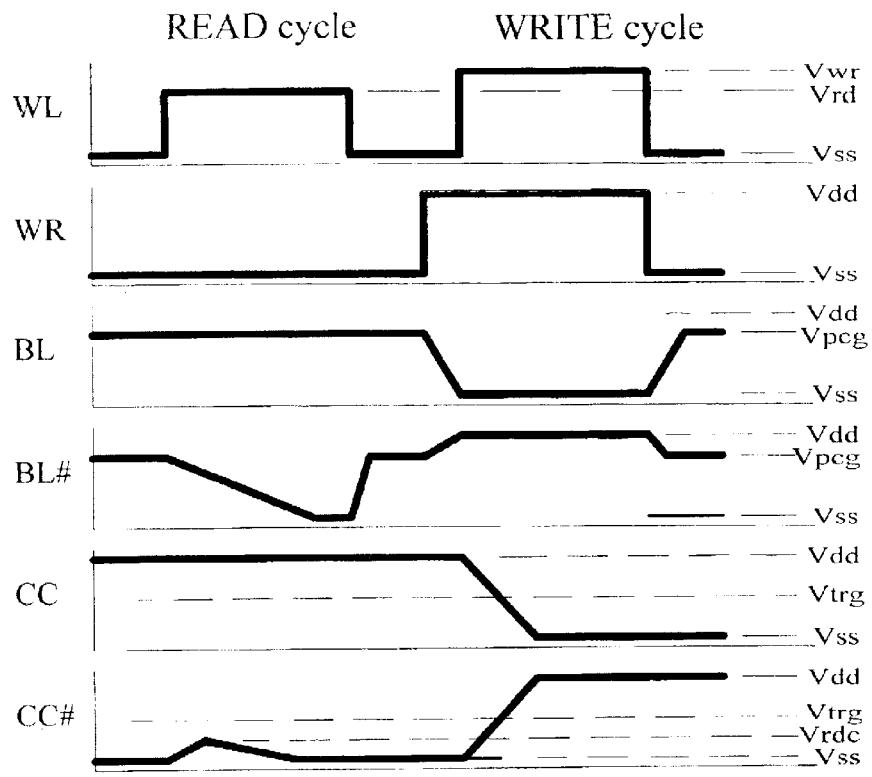
FIG. 7(b) illustrates the operation procedures for a "Single-Bit-Line-Write" (SBLW) mechanism providing different word line voltages during a read cycle and a write cycle.
Figures 7C, 7D:
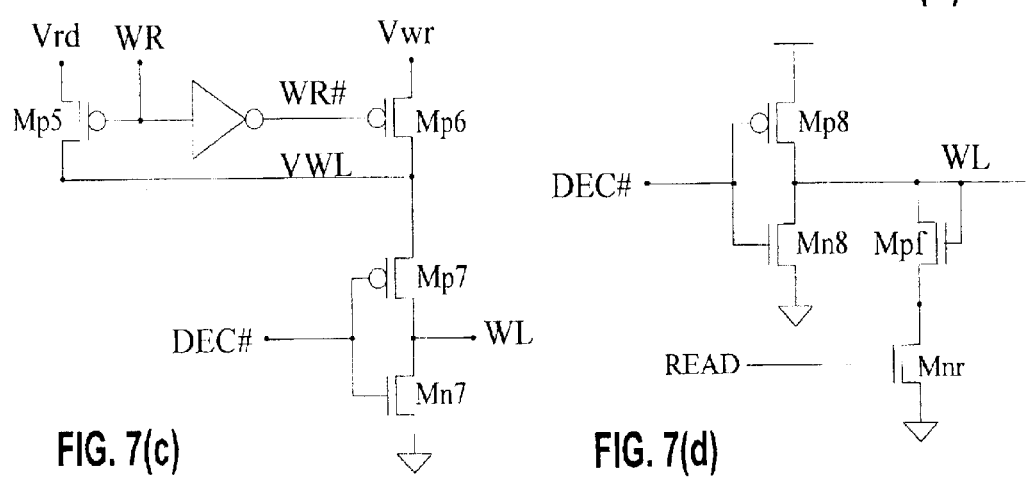
FIGS. 7(c,d) are schematic diagrams for an SBLW word-line drivers.
FIG. 7(e) illustrates the operation procedures for an SBLW mechanism providing different cell power supply voltages during a read cycle and a write cycle.
FIG. 7(f) illustrates the operation procedures for an SBLW mechanism providing different cell negative power supply voltages during a read cycle and a write cycle.
Figure 7E:
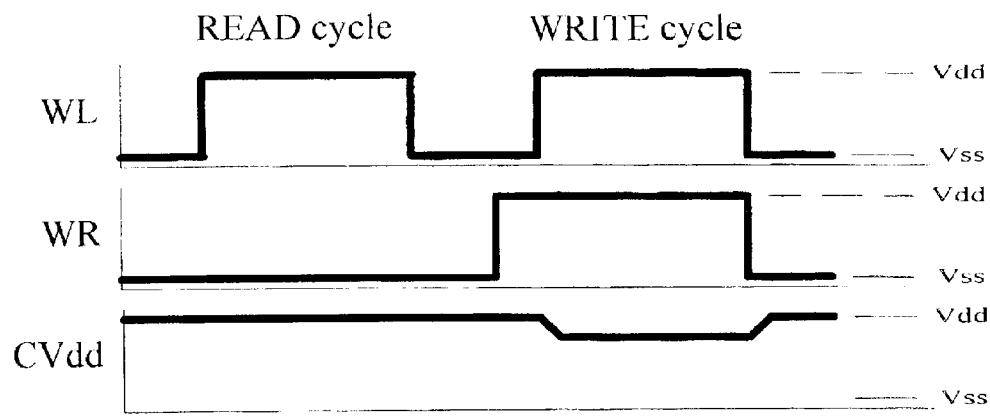
Figure 7F:
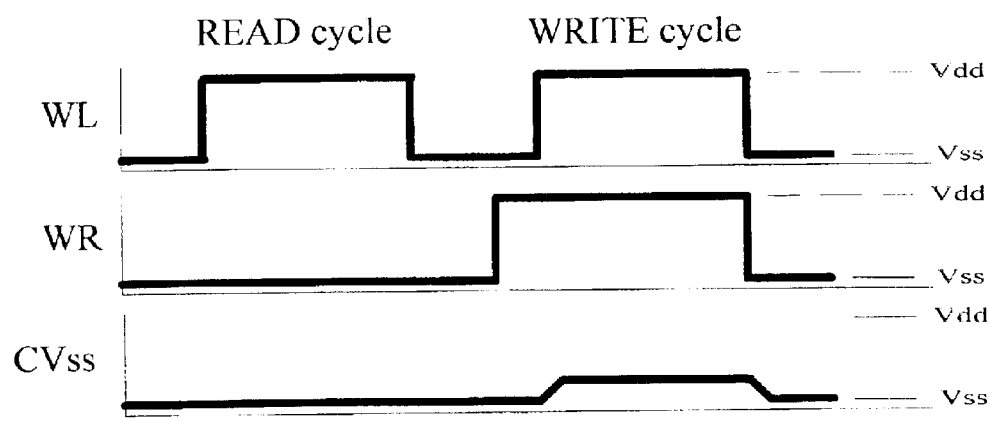

A novel write operation of the present invention, called "Single Bit Line Write" (SBLW) mechanism, is designed to allow writing both high and low voltages into a static memory cell using one bit line. In the meantime, the new SBLW method of this invention is able to satisfy the requirements of preventing the read disturb problems. FIG. 7(b) shows one example of SBLW method. During a read cycle, a lower voltage (Vrd) is applied on the word line (WL). This voltage Vrd is enough to activate the selected memory cell to support read operation, while the read disturb voltage (Vrdc) is kept safely below the trigger voltage (Vtrg). During a write cycle, a higher voltage (Vwr) is applied on the word line (WL). This higher word line voltage (Vwr) increases the driving capability of activated select transistor (Mw1), making it possible to pull the voltage on storage node (CC) above trigger voltage (Vtrg). Therefore, it is possible to write both logic state '1' and logic state '0' into static memory cell using one bit line while we can still meet read disturb requirement. Referring to FIG. 7(c) for an example of the word line driver to support the SBLW method as that shown in FIG. 7(b). The transistors MP7 and MN7 form a driver to drive the word line (WL) according to decoded signal DEC#. During a write cycle when the write signal (WR) is high, the transistor MP6 is turned on so that the write cycle word line voltage (Vwr) is placed on the word line. During a read cycle when the write signal (WR) is low, the transistor MP5 is turned on so that read cycle word line voltage Vrd is placed on the word line. The driver as shown in the circuits of FIG. 7(c) requires voltage generator to generate voltage Vrd and Vwr. FIG. 7(d) shows another example of the SBLW word line driver where transistors MP8 and MN8 for a driver to drive the word line (WL) according to a decoded signal DEC#. During a read cycle, the read signal (READ) is high and the transistor Mnr is turned on for connection to the ground. When the word line WL is pulled high, a feedback transistor Mnf is activated so that the transistor Mnr and Mnf carry out a function to pull donw the voltage of the word line WL. Therefore, during a read cycle, the word line voltage is determined by the relative sizes of the pull up transistor MP8 and the series pull down transistors Mnr and Mnf. During a write cycle, the signal READ is low such that the word line WL is driven to the full power supply voltage higher than the word line votage during the read cycles. The SBLW method also can be implemented by controlling the memory cell power supply voltages (CVdd, CVss). FIG. 7(e) shows a method that achieve single bit line write capability by lowering CVdd of selected memory cell during a write cycle, while FIG. 7(f) shows a SBLW method that increases the CVss of the selected memory cell during write cycle. It is also possible to use combinations of the methods as that shown in FIGS. 7(b, e, f) to achieve the purpose. The voltages as that designated by CVdd and CVss in the drawings can be a constant voltage or a voltage controlled by decoding logic circuits depending on the requirements of different applications.

Figures 8A, 8B:
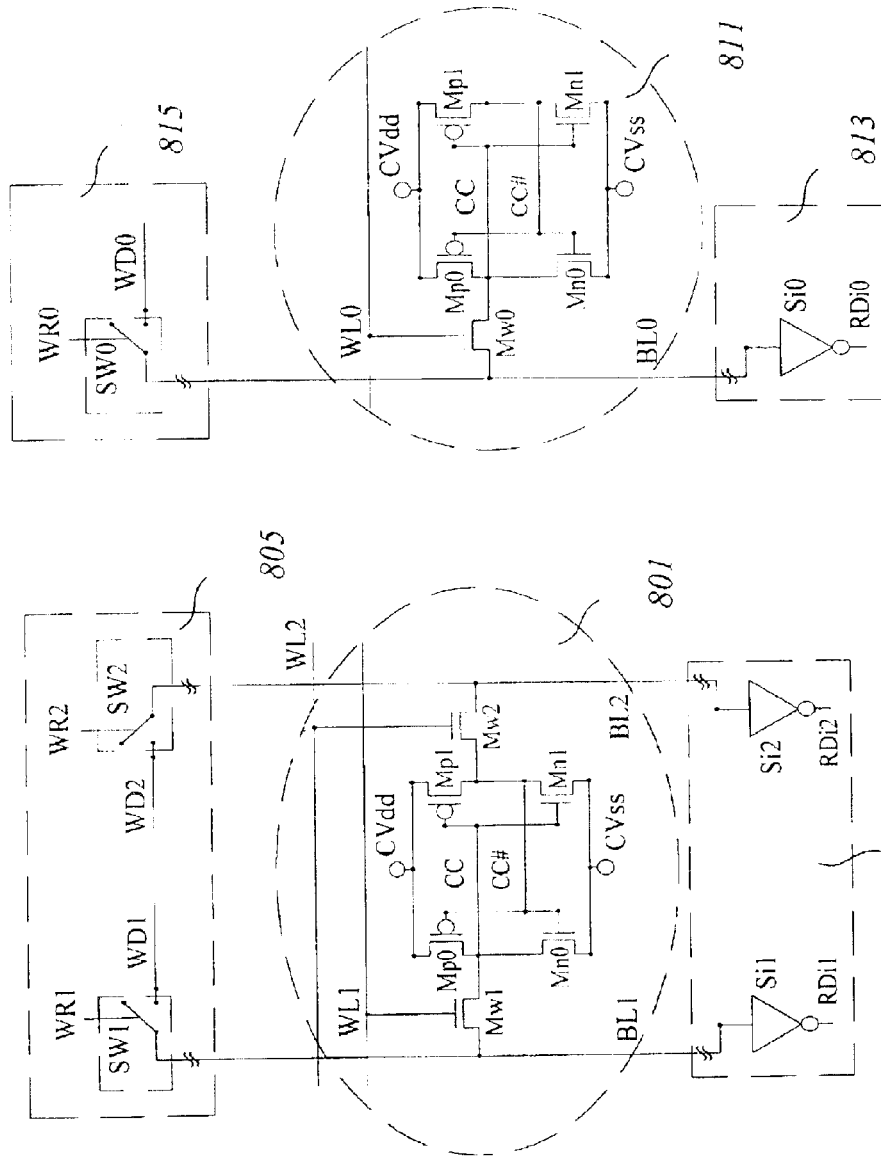
FIG. 8(a) is the schematic diagram for a 6T dual port memory using SBLW.
FIG. 8(b) is the schematic diagram for a 5T single port memory using SBLW.
Figures 8C, 8D:
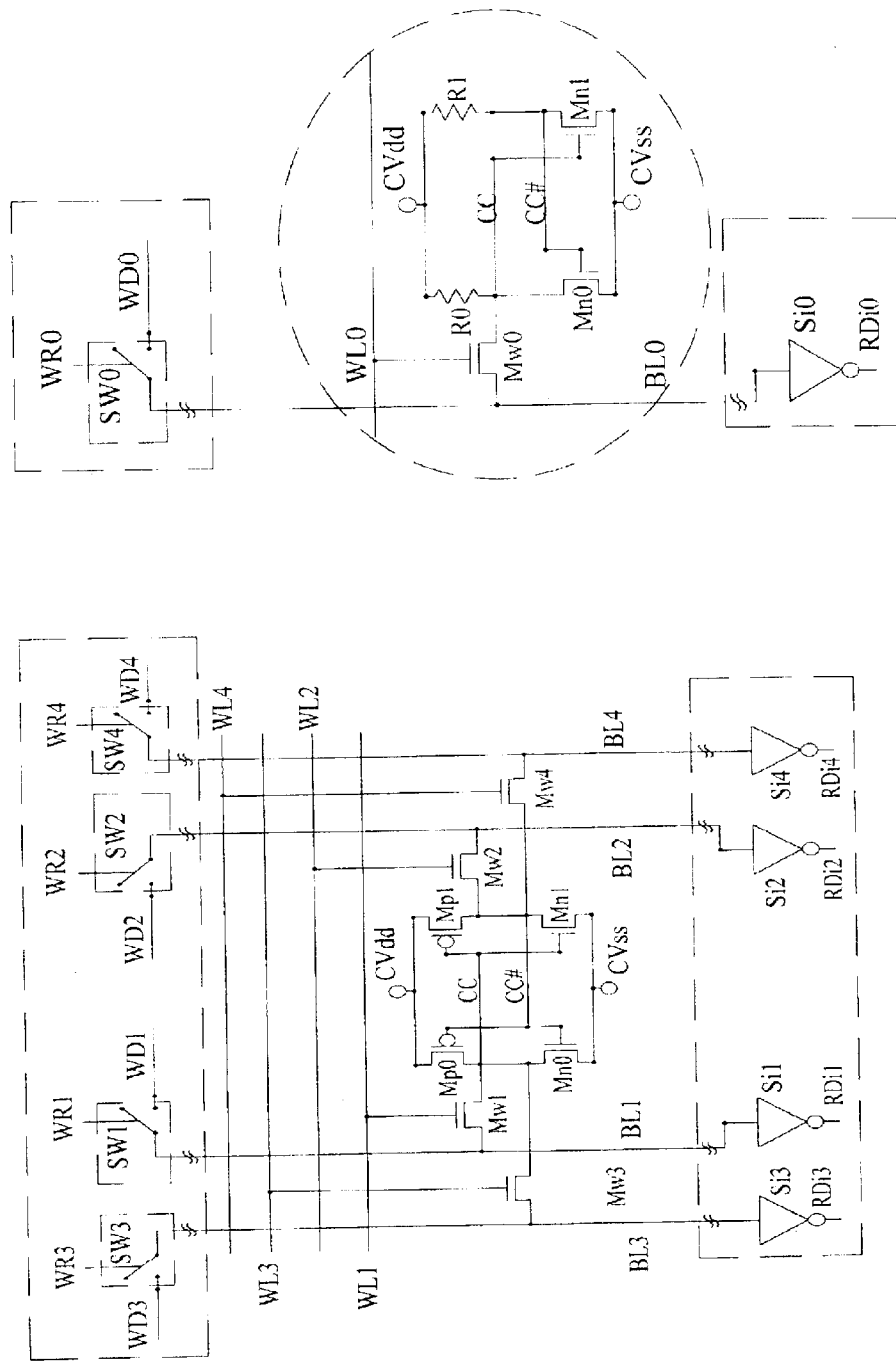
FIG. 8(c) is the schematic diagram for an 8T quadruple port memory using SBLW.
FIG. 8(d) is the schematic diagram for a 3T2R single port memory using SBLW.

With applying the SBLW technology, executing of both the read and write operations can be carried out by using one bit line while meeting both read disturb and write stability requirements. FIG. 8(a) shows the schematic diagram for a 6T memory of the present invention that can support fully independent dual port operations using SBLW. The memory cell (801) and read circuits (803) of this dual port memory is identical to the prior memory cell shown in FIG. 6(c), while its write circuit (805) comprises two independent switches (SW1, SW2) controlled by two independent write control signals (WR1, WR2). Using the SBLW technology, we only need one bit line (BL1, BL2) to support an independent write or read operation. It is therefore possible to support fully independent dual port operations. The resulting dual port memory product is roughly half the size of the prior art dual port memory shown in FIG. 6(b). It also has better performance while consuming less power. For single port operations, we no longer need 6 transistors. FIG. 8(b) shows a 5 transistor (5T) single port static memory of the present invention. This memory only need one bit line (BL0) to support all of its operations. The resulting product is typically 20–40% smaller than prior art single port static memory. For other multiple port applications, we can simply add one more bit line, one more word line, and one more select transistor to build multiple port memories. FIG. 8(c) shows the schematic diagram of a 4 read port 4 write port (4R4W) static memory of the present invention.

Figure 8F:
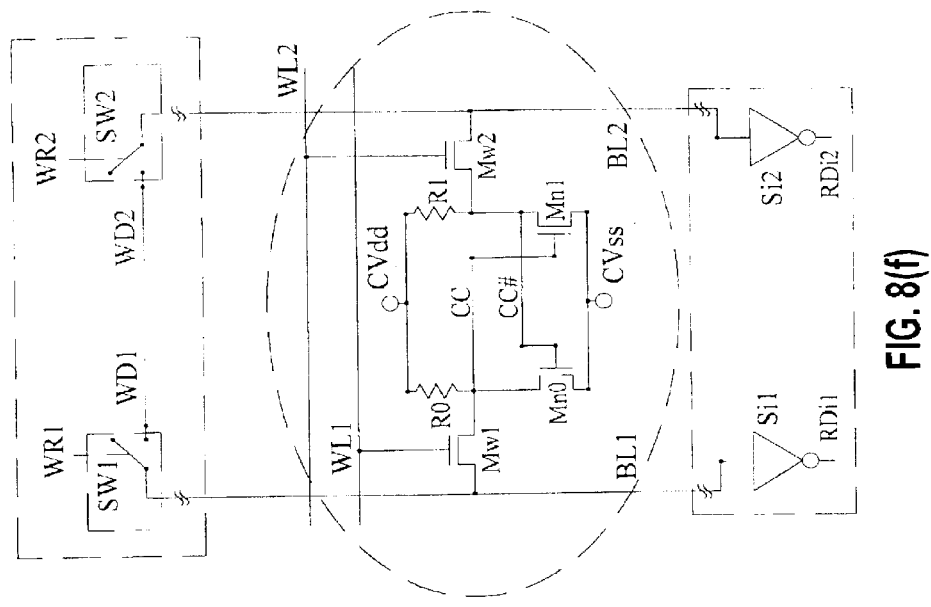
FIG. 8(f) is the schematic diagram for a 4T2R dual port memory using SBLW.
Figure 8E:
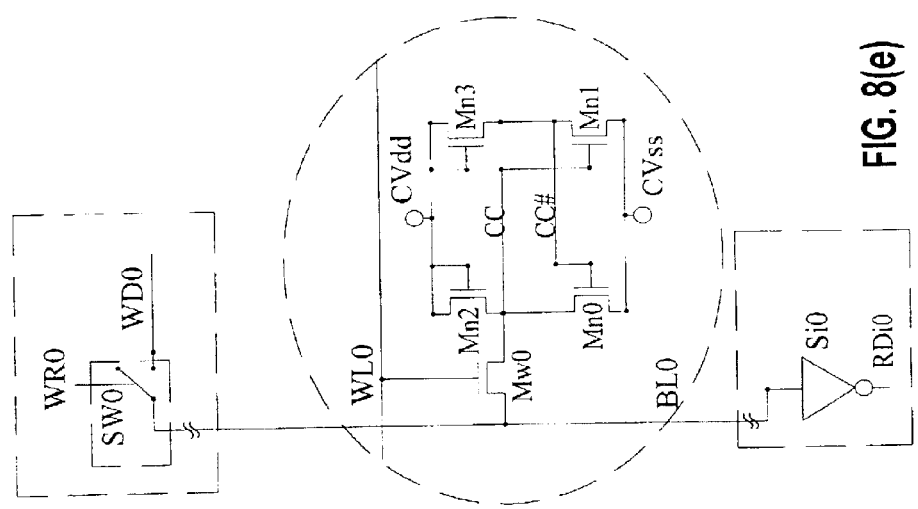
FIG. 8(e) is the schematic diagram for a 5T NMOS single port memory using SBLW.

While specific embodiments of the invention have been illustrated and described herein, it is realized that other modifications and changes will occur to those skilled in the art. For example, the SBLW technique also can be applied for 4 transistor (4T) memory cell or NMOS memory cells. FIG. 8(d) shows an example of a 3-transistor-2-resistor (3T2R) single port memory of the present invention. FIG. 8(e) shows an example of a 5-transistor NMOS single port memory of the present invention. FIG. 8(f) shows an example of a 4-transistor-2-resistor (4T2R) dual port memory of the present invention. FIG. 8(g) shows an example of a 6-transistor NMOS dual port memory of the present invention. For the situation when the bit line loading is very high, we may want to use differential sense amplifier to support each read port. Under that situation, we may need a pair of bit line to support a read port, while using single bit line to support a write port. FIG. 8(h) shows an example of a 1 read port 2 write port (1R2W) memory. FIG. 8(i) shows an interesting example when a dual port memory of the present invention having vertical data paths for its two ports. This device can support column-in-row-out, or row-in-column-out memory operations.

Beside dramatic improvements in speed, power, and area, the memory products of the present invention have many other advantages. Using B select method under the evenly scaled multiple level architecture, a static memory device of the present intention always has very low bit line loading at the bottom level. There is no need to use small signal differential sensing, even when the total memory is very large. We can use simple logic circuits such as an inverter as the sensing circuit for a static memory of the present invention. The memory device will operate at logic signal level so that its noise sensitivity will be dramatically reduced. The SBLW method not only allow us to reduce the number of bit lines by 50%, it also helps to make the memory device more stable. Prior art static memory rely on sizing of transistors to meet read disturb and write stability requirements. The prior art static memory is therefore sensitive to variations in manufacture fluctuations. The SBLW mechanism uses voltages to control read disturb and write stability problems, which is by far easier than controlling manufacture parameters. The resulting memory products are therefore by far more reliable. A memory designed in this way will have no sensitive circuit element, no race condition, and there is no need to use any complex control mechanism such as a timer. The static memory modules of the present invention are therefore as fast and as tough as current art register files, while its area is smaller than conventional 6T static memory devices.

Figure 3:
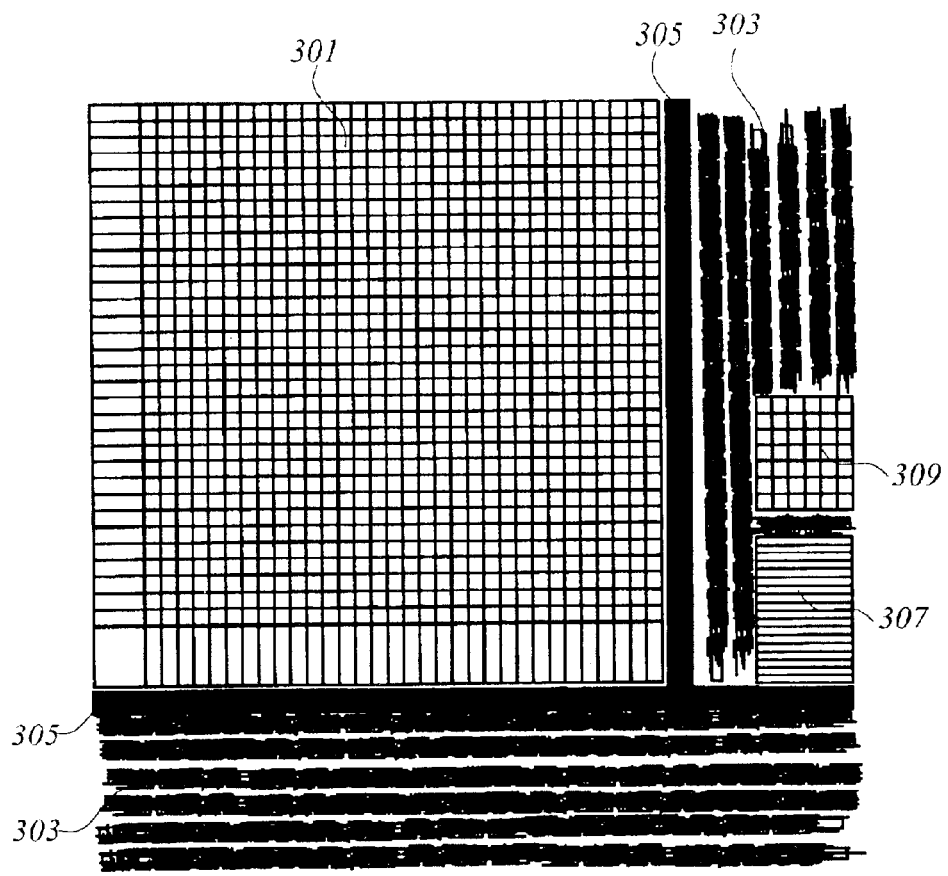
FIG. 3 illustrates the floor plan for a typical prior art IC with embedded memory modules.
Figure 9:
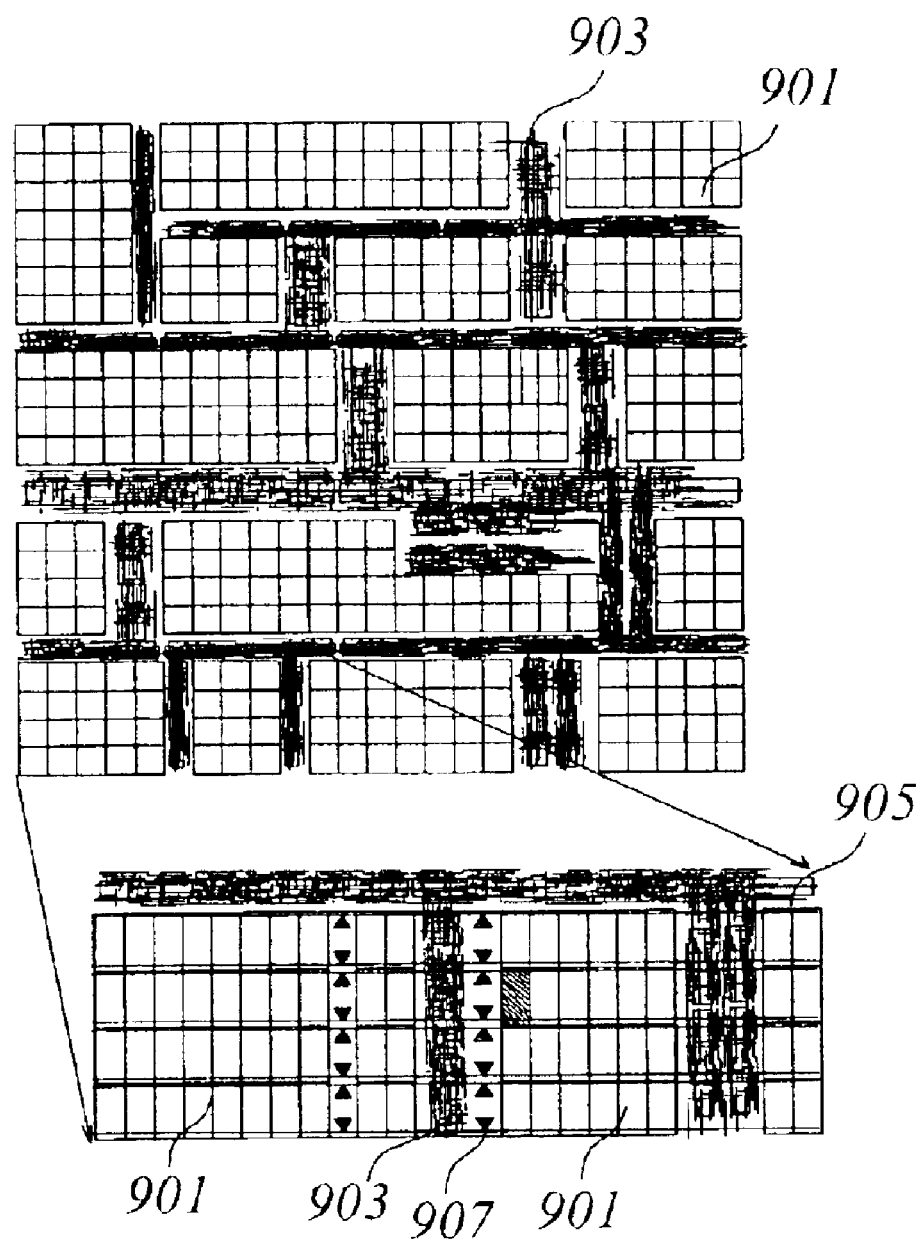
FIG. 9 shows the floor plan for an IC equipped with embedded memory of the present invention.

Using such a memory as embedded memory, there is no need to treat the memory array as an unbreakable unit. FIG. 9 shows an example of an IC using embedded memory modules of the present invention. Memory modules are arranged in architecture of the present invention as shown in the magnified block (905) in the lower half of FIG. 9. Unlike prior art memory modules (301, 309) in FIG. 3, a memory module of the present invention has such a wonder noise tolerance, it can allow logic circuits (903) to mix with the memory components (901) in the floor plan. Logic circuits (903) can interact with the multiple level memory at different levels to achieve excellent performance. Logic circuit also can use drivers (907) connecting to memory data path as a method to communicate with other modules in the IC. Logic signals also can travel through memory modules to reach other circuits. Memory modules are no longer communication barriers. The placements and signal connections of both the memory and logic circuits can be automatically optmized by place-and-route computer aided design (CAD) tools using similar mechanism as current art place and rout tools.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

I claim:

1. A semiconductor memory array comprising a plurality of memory cells wherein each of said memory cells are further connect to a bit-line and a word-line for reading and writing a data signal from said memory cell, said memory array further comprising:
a power supply for providing a high and a low memory cell voltages; and
a read voltage means and a write voltage means for applying a read and write voltage relative to said high and low voltages on said word-lines for reading and writing said data signal respectively from each of said memory cells wherein said read voltage is different from said write voltage.

2. The semiconductor memory array of claim 1 wherein:
said power supply maintaining said high and low memory cell voltage and said write voltage means applying a higher write voltage and said read voltage means applying a lower read voltage on said word-line.

3. The semiconductor memory array of claim 1 wherein:
said write voltage means and said read voltage means applying a same voltage on said word-line for writing and reading said data signal and said power supply is controlled to provide a lower high voltage during a write cycle as said write voltage is applying said write voltage on said word-line.

4. The semiconductor memory array of claim 1 wherein:
said write voltage means and said read voltage means applying a same voltage on said word-line for writing and reading said data signal and said power supply is controlled to provide a higher low voltage during a write cycle as said write voltage is applying said write voltage on said word-line.

5. The semiconductor memory array of claim 1 wherein:
said write voltage means and said read voltage means applying a same voltage on said word-line for writing and reading said data signal and said power supply is controlled to provide a higher high voltage during a read cycle as said read voltage is applying said read voltage on said word-line.

6. The semiconductor memory array of claim 1 wherein:
said write voltage means and said read voltage means applying a same voltage on said word-line for writing and reading said data signal and said power supply is controlled to provide a lower low voltage during a read cycle as said read voltage is applying said read voltage on said word-line.

7. The semiconductor memory array of claim 1 wherein:
each of said memory cells is connected to a single bit line is provided for writing a data bit of either a high voltage or low voltage into said memory cells.

8. The semiconductor memory array of claim 1 wherein:
each of said memory cells is connected to a single bit line for reading a data bit from and writing a data bit into said memory cells.

9. A semiconductor memory array comprising a plurality of memory cells wherein each of said memory cells are further connect to a bit-line and a word-line for reading and writing a data signal from said memory cell, said memory array further comprising:
a power supply for providing a high and a low memory cell voltages;
a read voltage means and a write voltage means for applying a read and write voltage relative to said high and low voltages on said word-lines for reading and writing said data signal respectively from each of said memory cells wherein said read voltage is different from said write voltage; and
each of said bit-lines is connected to a signal sensing circuit operable at a logic-signal sensing level whereby memory signal sensing is not disturbed by logic-circuit noises.

10. The semiconductor memory array of claim 9 wherein:
said signal sensing circuit comprises an inverter.

11. An integrated circuit (IC) comprising:
a memory array comprising a plurality of memory cells wherein each of said memory cells are further connect to a bit-line and a word-line for reading and writing a data signal from said memory cell;
each of said bit-lines is connected to a signal sensing circuit operable at a logic-signal sensing level significantly higher than a memory sensing level whereby memory signal sensing is not disturbed by logic-circuit noises without requiring a noise reduction circuit
a logic circuit array disposed immediately next to said memory array.

* * * * *